(12) United States Patent
Arvin et al.

(10) Patent No.: US 7,781,232 B2
(45) Date of Patent: Aug. 24, 2010

(54) METHOD TO RECOVER UNDERFILLED MODULES BY SELECTIVE REMOVAL OF DISCRETE COMPONENTS

(75) Inventors: Charles L. Arvin, Poughkeepsie, NY (US); Benjamin V. Fasano, New Windsor, NY (US); Mario J. Interrante, New Paltz, NY (US); Glenn A. Pomerantz, Kerhonkson, NY (US)

(73) Assignee: International Business Machines Corporation, Armonk, NY (US)

( * ) Notice: Subject to any disclaimer, the term of this patent is extended or adjusted under 35 U.S.C. 154(b) by 226 days.

(21) Appl. No.: 12/015,754

(22) Filed: Jan. 17, 2008

(65) Prior Publication Data

US 2009/0184407 A1 Jul. 23, 2009

(51) Int. Cl.
*H01L 21/48* (2006.01)
*H01L 21/00* (2006.01)
(52) U.S. Cl. .......................................... 438/4; 257/737
(58) Field of Classification Search .................... 438/4; 257/737
See application file for complete search history.

(56) References Cited

U.S. PATENT DOCUMENTS 5,355,580 A 10/1994 Tsukada
7,014,094 B2 * 3/2006 Alcoe ..................... 228/180.22

* cited by examiner

*Primary Examiner*—Evan Pert
(74) *Attorney, Agent, or Firm*—DeLio & Peterson, LLC; Kelly M. Nowak; Wenjie Li

(57) ABSTRACT

Methods and reworked intermediate and resultant electronic modules made thereby, whereby a component in need of rework is located and removed from the module to reveal encapsulated solder connections residing within an underfill matrix. Heights of both the solder connections and underfill matrix are reduced, followed by etching the solder out of the solder connections to form openings within the underfill matrix. The underfill material is then removed to expose metallurgy of the substrate. A blank having a release layer with an array of solder connections is aligned with the exposed metallurgy, and this solder array is transferred from the blank onto the metallurgy. The transferred solder connections are then flattened using heat and pressure, followed by attaching solder connections of a new component to the flattened solder connections and underfilling these reworked solder connections residing between the new chip and substrate.

20 Claims, 8 Drawing Sheets

METHOD TO RECOVER UNDERFILLED MODULES BY SELECTIVE REMOVAL OF DISCRETE COMPONENTS

BACKGROUND OF THE INVENTION

1. Field of the Invention

The present invention relates to electronic devices, and in particular, to removing and reworking underfilled integrated circuit chips on an electronic module.

2. Description of Related Art

Electronic components include both Single Chip Modules (SCMs) and Multi Chip Modules (MCMs). While SCMs contain a single chip, MCMs contain numerous chips on a substrate, and as such, are key components for many high-end computer servers and mainframes.

Often, the electronic components in SCMs and MCMs are joined to other components by solder interconnections whereby these solder interconnections are made by soldering pads on a surface of a first of these electronic components to corresponding soldering pads on the surface of the second component. Typical solder surface mount processes involve screening solder paste onto exposed metallic pads of a board or substrate, followed by a thermal reflow to bring the solder into spherical shapes. Alternately, solder preforms may be attached to exposed metallic pads. The reflowed solder or solder ball perform is aligned to corresponding pads on another component, and then the entire assembly is reflowed to melt the solder and create a solder bond between the first and second components. This solder interconnection may be in the form of a ball grid array (BGA) or column grid array (CGA).

Flip chip joining, or controlled chip collapse connection (C4) technology, also exploits the use of a relatively small solder bump to join the pads on the chip to corresponding pads on the substrate. Electrical and mechanical interconnects are formed simultaneously by reflowing the bumps at an elevated temperature above the melting point of the solder. The C4 joining process is self-aligning in that the wetting action of the solder will align the chip's bump pattern to the corresponding substrate pads. These solder bumps are then underfilled (or encapsulated) to protect them from moisture, mobile ions, corrosives (e.g., acidic or alkaline species) and separation of the solder bump electrical connections, all of which will adversely affect the performance of the package. The underfill also provides mechanical support to the chip, and maintains both the mechanical integrity of the chip due to stresses from assembly operations and the overall electrical reliability of the solder bumps and electronic package.

After forming the solder bumps between the chip(s) and substrate, testing one or more of these chips may show them to be defective. Without underfill present, the defective chip(s) can be replaced with new chips. The removal of a chip is usually performed by heating and lifting the defective chip from the substrate, followed by replacing it with a new chip. This is termed rework and can often be performed numerous times without degrading the quality or reliability of the reworked electronic module. This rework provides great monetary value in recovery of expensive modules.

Sometimes a defective die is not discovered before underfill introduction and during routine testing. This can occur due to incomplete initial test coverage or the inability to drive all circuits under highly stressful thermal environments, which are difficult to create without underfilling the die. When a module with underfill residing between the chip and substrate is found to have a defective die this presents a number of problems in the rework process since the underfill material is generally a very durable material by design. For instance, wherein the solder bumps are lead free solder interconnects, the lead-free interconnections often require the use of higher temperatures during reflow attachment, and even higher temperatures for rework processing. However, the higher rework temperatures can irreparably damage adjacent components on an organic or ceramic board, and as such, rework of lead free alloy containing assemblies has become a critical issue in the qualification of this technology. Thus, rework processes for various assembly materials must be selective for a particular material, such that, it causes no detriment to the substrate integrity and electrical performance. The removal process must not damage the board onto which the chips are mounted and is preferably simple and accurate in its ability to selectively rework what are often very tightly packed components. The resulting joins between the reworked chip and board must be reliable to recreate the overall integrity of the module. The chip must also be capable of being tested and underfilled again to provide the same mechanical integrity that was present in the initial chip join. It is also required that the removal method be environmentally and chemically suitable for use in a manufacturing environment.

Therefore, a need continues to exist in the art for providing improved methods and structures for the rework of electronic modules, and in particular, for the removal of electronic components joined to organic boards by solder interconnections for their subsequent use and re-use in electronic assemblies and systems.

SUMMARY OF THE INVENTION

Bearing in mind the problems and deficiencies of the prior art, it is therefore an object of the present invention to provide improved methods and structures for the rework of electronic assemblies.

It is another object of the present invention to provide improved methods and structures for the removal of electronic components joined to substrates by solder interconnections for their subsequent use and re-use in electronic assemblies and systems.

A further object of the invention is to provide easy and efficient methods for separating electronic components joined by solder connections and, in particular, lead-free solder connections without adversely affecting the electrical performance of the module.

It is yet another object of the present invention to provide time efficient, easy and cost effective manufacturable methods for reworking expensive high-end, single and multi-chip modules for use and re-use.

A further object of the invention is to provide an electronic module reworked using the methods and structures of the invention.

Still other objects and advantages of the invention will in part be obvious and will in part be apparent from the specification.

The above and other objects, which will be apparent to those skilled in the art, are achieved in the present invention, which is directed to methods for reworking an underfilled module. These methods include providing a module having at least one electronic device or component joined to a substrate by solder connections, whereby the solder connections are encapsulated by an underfill matrix. The component is removed, preferably by milling, to reveal the solder connections encapsulated within the underfill matrix. Substantially all of the solder material of the solder connections is then removed from the underfill matrix to form openings within the underfill matrix. In so doing, metallurgy of the substrate is exposed at a bottom of these openings. A next step involves the removal of the remaining perforated underfill matrix and exposing the underlying pads on the substrate. Solder which is of the desired melting point is then transferred onto the pads so as to contact the exposed metallurgy and form transferred solder connections, which are then flattened to provide flattened solder connections on the substrate. A new electronic device or component may then be attached to the module by joining solder connections of this new electronic device or component to the flattened solder connections providing electrical connections that can be tested. An underfill material is then applied to join the new electronic device or component to the underfill matrix as well as encapsulate the solder connections there-between.

Prior to removing the solder from the underfill material, the underfill matrix and the solder connections may remain at their original heights, which refers to the heights of such underfill matrix and solder connections prior to removing the electronic device or component. However, preferably the heights of both the solder connections and the underfill matrix are reduced after the electronic device or component has been removed. In so doing, the heights of the solder connections and underfill matrix may be reduced anywhere from below their original heights down to about 10 microns above the exposed metallurgy. These reduced heights simplify the subsequent removal processes.

In accordance with the invention, the solder material may be removed from the underfill matrix by first etching the exposed solder connections out of the underfill matrix to leave openings within such underfill matrix. Residual solder remaining within these openings is often part of the intermetallic formed during solder ball joining to the substrate and electronic device/component contacts.

The perforated underfill matrix is then preferably removed using a dry blasting process, such as, by using a mild abrasive material such as sodium bicarbonate which is projected against the perforated underfill matrix using a compressed gas directed through a nozzle. The gas-entrained abrasive abrasively removes the underfill matrix from the surface of the substrate with little damage to the substrate surface. The abrasive also cleans the surfaces of the metallization pads preparing them for subsequent solder attach.

Further, in accordance with the invention, new solder may be transferred onto the exposed surface pads of the substrate by providing a blank chip having a release layer on a surface thereof for easily transferring an array of solder bumps applied onto said surface. An array of solder bumps is deposited on the release layer in a pattern corresponding to the pattern of the connections of the die. The array of solder connections are then aligned with and applied to the site that is to be reworked. The module and blank chip assembly are heated to reflow and transfer the solder connections from the blank onto the solder pads on the substrate. The blank may then be removed from the module allowing visual inspection and confirmation of the solder transfer onto every connection on the substrate.

In flattening the transferred solder connections, a planar surface of a weighted flattening substrate, often a piece of silicon the size of the rework site, is provided in contact with the transferred solder connections. The module is preferably heated, and pressure is applied to the flattening substrate such that heat and pressure flatten the transferred solder connections to form reworked, flattened solder connections on the reworked module site. These flattened solder connections have top surfaces that are substantially planar and provide a very uniform contact surface for subsequent chip joining.

A replacement electronic device or component is now aligned and placed onto the flattened solder pads of the reworked site on the module and reflowed to establish solder connections between the new electronic device or component and the module. The module typically is electrically tested to confirm the integrity of the contacts and if deemed acceptable, would be underfilled.

The present invention may be employed with a variety of material sets. For instance, the substrate may be a ceramic substrate, a silicon substrate, a glass substrate or even an organic substrate. The underfill matrix may comprise a material including, but not limited to, a low profile cure material, a high performance cure material, and a reworkable cure material. The solder connections may include a low melting point solder, a high melting point solder, and combinations thereof including composite solder features which have solders of different compositions and melting temperatures in a layered or capped structure. Preferably, the flattened solder connections and solder connections of the new component each comprise a solder material having a melting point low enough so as not to degrade the underfill matrix of adjacent chips or the electrical performance of adjacent devices. As such, depending on the end use of the resultant module, the flattened solder connections and the solder connections of the new semiconductor may comprise solder materials including, but not limited to, a eutectic solder, a near eutectic solder, a non-eutectic solder, a low melting point solder, a high melting point solder, and even any combination thereof.

In another aspect, an electronic device or component in need of rework is removed by milling and the exposed solder connections are etched out from the underfill matrix. A blank substrate having an array of solder connections in a pattern corresponding to the pattern of the openings in the underfill matrix is then provided, and this array of solder connections is transferred from the blank into the openings such that the array of solder connections contact exposed metallurgy at a bottom thereof. The transferred solder connections are then flattened, and a new electronic device or component joined to the flattened solder connections. An underfill material is applied to join the new electronic device or component to the underfill matrix as well as encapsulate the solder connections thereof. The new electronic device or component may have low temperature solder bumps or high temperature solder bumps with a low temperature solder coating, whereby these bumps are aligned and reflowed onto the flattened solder connections at a temperature that does not degrade the adjacent underfilled die or temperature sensitive components. An underfill material is then applied to join the new electronic device or component to the substrate.

In yet another aspect, the invention is directed to both the reworked intermediate electronic modules and resultant electronic modules formed by the present methods.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1-9C of the drawings in which like numerals refer to like features of the invention.

The material set and method disclosed herein are the basis for a low cost electronic package rework process including appropriate hardware and equipment alternatives. An advantage of the foregoing rework method and material set is that it can be implemented on many levels of scale at minimal cost, with minimal effort and ease of flexibility, as well as across a variety of differing types and material sets of electronic packages.

Figure 1:
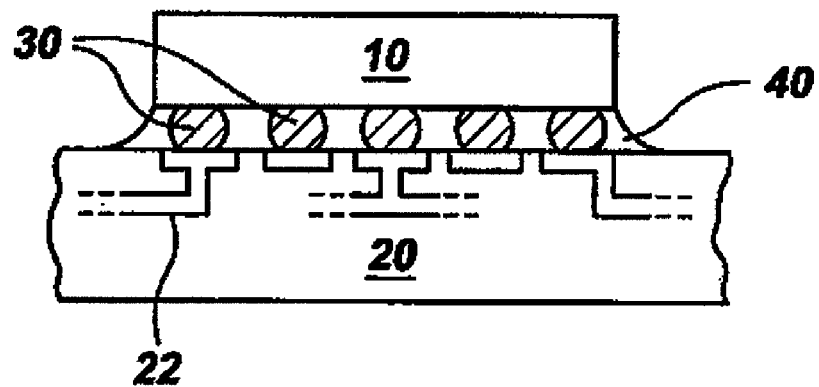
FIG. 1 is a cross-sectional view of an electronic module in need of rework having a semiconductor chip electrically connected to a substrate by solder connections that are encapsulated within an underfill matrix.

In accordance with the invention, an electronic package typically has many electrical components attached to a substrate using encapsulated solder connections. Referring to FIG. 1, for ease of understanding the invention, reference is made to the electronic device or component being removed from the module as a semiconductor chip or die 10 attached to a substrate 20 using solder connections 30 that are encapsulated using an underfill to form an underfill matrix 40. However, it should be appreciated and understood that the electronic device or component(s) being removed from the module may include, but is not limited to, a semiconductor chip, a module, a carrier, an interposer, and the like, or even combinations thereof.

The substrate 10 may be any known substrate including, but not limited to, a ceramic substrate, a silicon substrate, glass substrate, an organic substrate, and the like. The substrate may be a printed circuit board having electrical wiring 22 in the substrate 20 comprising vias filled with an electrically conductive material. The solder connections 30 make an electrical connection with a top surface of these electrical wirings 22 residing at the substrate surface. The underfill material fills the space between the chip 10 and substrate 20 to both bond the chip to the substrate and encapsulate the solder connections 30.

The solder connections 30 may include any known solder connection that is encapsulated with an underfill material. For instance, the solder connections 30 may include, but are not limited to, encapsulated solder balls, solder columns, solder bumps, etc. The solder connections 30 may be made of any low melting point solder or high melting point solder. The low melting point solder may include, but is not limited to, a eutectic tin-lead alloy (63Sn/37Pb or 60Sn/40Pb), 43Sn/43Pb/14Bi, 96.5Sn/3Ag/0.5Cu, and the like. Alternatively, the invention may be employed with high melting point solder may including, but not limited to, a 3-5% tin and 95-97% lead, a lead free solder or solder alloy (Sn/Ag, Sn/Ag/Cu, Sn/Cu), and the like The underfill matrix 40 may comprise any known material used for underfilling or encapsulating an electronic module. For instance, the underfill matrix may comprise a material including, but not limited to, a rapid cure or snap cure encapsulation underfill, a low profile cure, a high performance cure or even a reworkable cure underfill. The underfill is often filled or loaded with inorganic materials to improve mechanical properties, control rheology during dispensing and cure and also lower the thermal expansion of the underfill. The underfill matrix 40 protects the chip circuitry and solder bumps from moisture, mobile ions, radiation, corrosives and hostile operating environments, such as, thermal and mechanical conditions, shock and vibration.

In accordance with the invention, a component (e.g., chip) in need of rework, or replacement due to engineering changes, is first detected and located on the substrate 20. Once located, the chip (or chips) is then removed. It is often desirable to protect adjacent devices from damage during the rework process described herein. This may include creating barriers or covers for adjacent devices to protect them from mechanical damage or chemical exposure. If the adjacent die and components are underfilled they are typically well protected from mechanical and chemical attack. Similarly adjacent component(s) can be covered by a temporary protective coating such that the device(s) can be exposed to debris from milling or grinding, chemical etchants, abrasive blasting operations and other operations that are performed on a reworked chipsite that can affect these devices. These can include water soluble and solvent soluble coatings such as acrylates, styrenes and other polymers that can be easily applied in patterns and subsequently removed by chemical operations.

Figure 2:
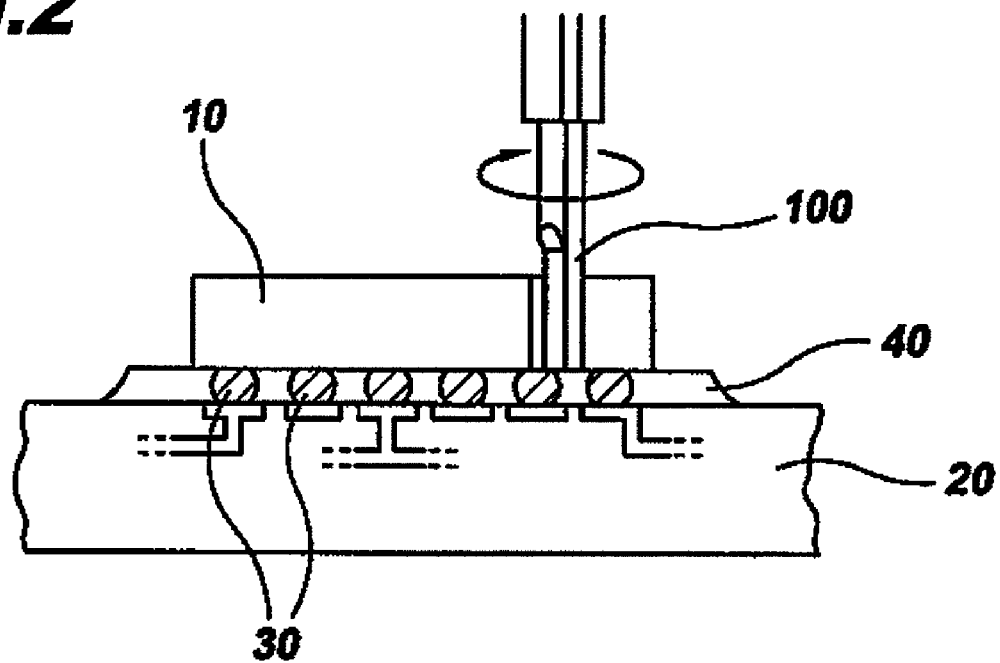
FIG. 2 is a cross-sectional view showing the chip of FIG. 1 being removed from the module, whereby the milling bit slices into the tops of the solder connections.

Referring to FIG. 2, in a preferred embodiment the chip may be removed by conventional mechanical cutting techniques, such as, known milling techniques using milling tool 100 having a carbide or preferably a diamond bit. The milling tool 100 may remove the chip(s) by positioning the end of the milling tool so that it is about at the same level as the bottom surface of the chip in the Z-plane, and then the tool rotates moving in the X,Y-plane to cut away and remove the chip. Alternatively, the milling tool may reside horizontally so that it resides in parallel with the chip surface for the removal of such chip. The chip may also be removed by a grinding method using an abrasive wheel, often consisting of a sintered ceramic or ceramic composite such as aluminum oxide, boron carbide, silicon carbide and other hard materials. As an alternative to mechanical cutting techniques, the chip(s) may be removed by heating the electronic module to a temperature about the glass transition temperature of the underfill material. This softens the material of the underfill matrix so that the chip may then be more easily removed, such as, by peeling the chip off the module.

Figure 3A:
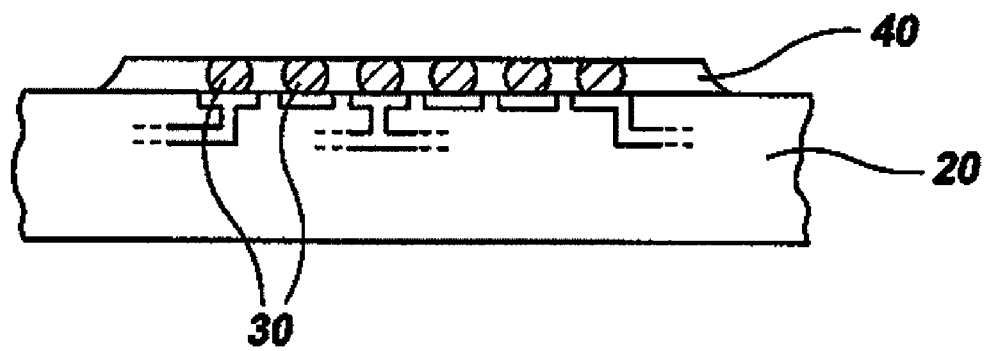
FIG. 3A shows an embodiment of the invention whereby the exposed underfill and solder connections remain at essentially their original heights after removal of the chip.
Figure 3B:
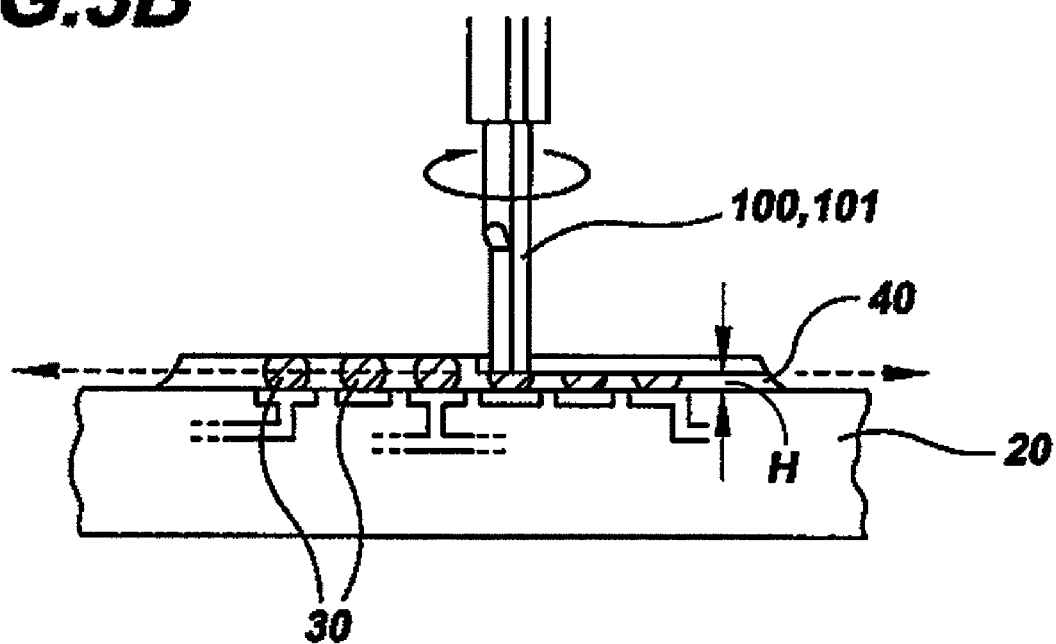
FIG. 3B shows an alternate embodiment of the invention whereby the heights of the underfill and solder connections are reduced after removal of the chip, preferably to about half their original heights.

Once the chip(s) has been removed, the solder connections 30 and underfill matrix 40 may remain at their original height (FIG. 3A), or portions of both the solder connections 30 and underfill matrix 40 are removed (FIG. 3B). Referring to FIG. 3B, preferably, portions of both the solder connections 30 and underfill matrix 40 are removed, such as, by using known mechanical cutting techniques. For instance, the heights of the solder connections and underfill matrix may be reduced or removed using the milling tool 100 discussed above, or more preferably, using a finishing end mill 101. The heights of the solder connections and underfill matrix are reduced from an original height of the solder and underfill matrix to a reduced height "H", whereby the "original height" refers to the heights of the solder and underfill matrix before the chip(s) has been removed. This process also planarizes the top surfaces of the solder connections 30 and underfill matrix 40

The heights of both the solder connections 30 and underfill matrix 40 may be reduced down to within 25 microns, more preferably to with 10 microns, of the exposed metallurgy 25 (i.e., metal contacts or pads) on the surface of substrate 20. If the solder connections and underfill are reduced too deeply during milling, such that the removal process contacts the metallurgy 25 on the substrate surface, the solder wettability characteristics of such metallurgy would undesirably change. As such, it is preferred that this removal process leaves at least some of the solder connections and underfill matrix remaining over the substrate surface. While there is no upper limit since the solder and underfill matrix may remain at their original heights (FIG. 3A), in a preferred embodiment, the heights of the solder connections 30 and underfill matrix 40 may be reduced down to about 50% of their original heights, or even more or less than 50%. Most preferably, the heights of the solder connections 30 and underfill matrix 40 are reduced down to less than one half their original heights since this enables the exposure of the greatest area of solder to etching solutions used to remove such solder. These lower heights also facilitate the removal of the residual underfill in the preferred embodiment, and expedite the removal rate in subsequent operations.

Figure 4A:
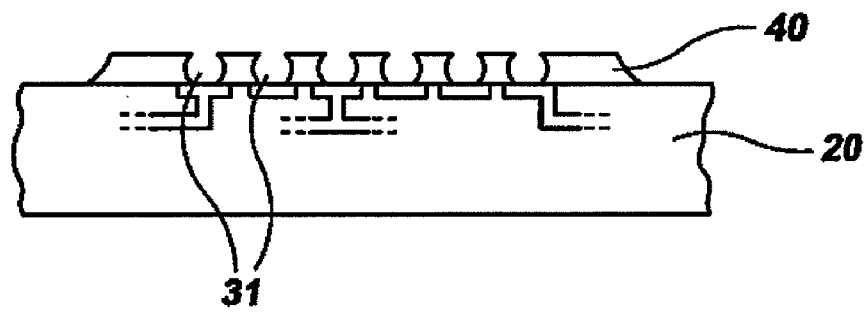
FIGS. 4A and 4B are alternate embodiments showing the steps of mechanically and chemically removing all solder material of solder connections from the underfill matrices of FIGS. 3A and 3B, respectively.
Figure 4B:
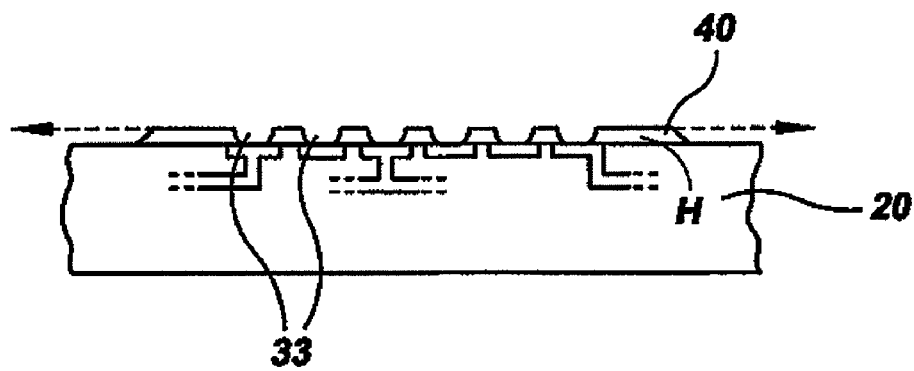

After the chips have been removed, and preferably, the heights of the solder connections and underfill matrix reduced, the electronic module may be cleaned to remove dust. Referring to FIGS. 4A and 4B, the solder remaining within the solder connections 30 is then removed to form empty, openings 31, 33 in the underfill matrix 40. In so doing, the remaining solder within the solder connections is first etched out of the underfill matrix using known etching techniques. However, prior to etching away the remaining solder, any hierarchy in need of protection on the exposed surfaces of the electronic module may be encapsulated to protect such hierarchy from the harsh etchants. This hierarchy may include, but is not limited to, chips, other modules, decoupling capacitors, passives and the like, which is encapsulated with an encapsulant, such as, a spray coated polymer (e.g., polystyrene) using a masking process or a gasket and frame, and the like, for the protection thereof.

The solder to be removed from the underfill matrix on the electronic module is then etched, such as by being exposed to and preferably immersed in an etching bath. It should be appreciated that the etchant and etch process will be selected based on the particular material sets of both the remaining solder being removed and the underfill matrix. For example, wherein the solder comprises a eutectic 97% lead/3% tin solder, the etch process may use an etch bath containing an acetic acid/$H_2O_2$ etchant at a preferred ratio of 50:50 V/V. If a Sn based solder is used for the solder connections a preferred etchant would 30 V % nitric acid. Alternately other etchants can be selected to preferentially remove the solder from within the underfill without attacking other components on the module. By etching away the solder connections 30 from within the underfill matrix 40, openings are formed in the underfill matrix.

Figure 4C:
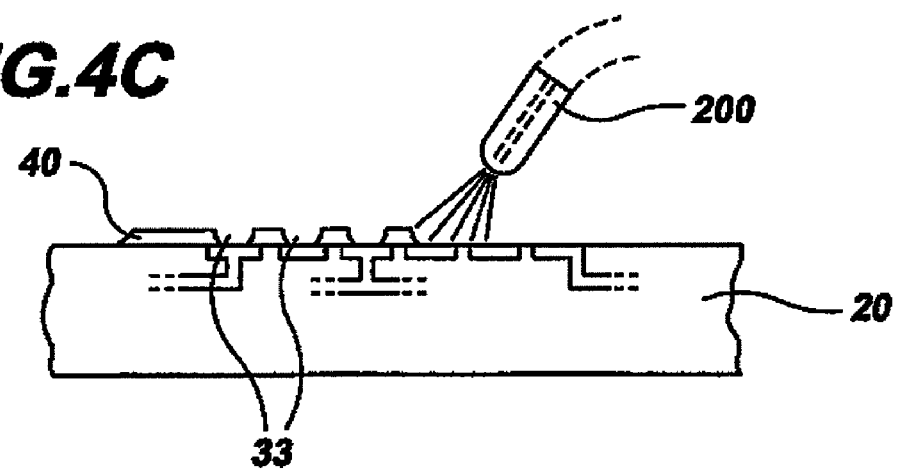
FIG. 4C shows a preferred embodiment of the invention whereby after the solder has been removed from the underfill matrix, the residual underfill matrix is removed and the surface of the substrate cleaned.

Referring to FIG. 4C, in the preferred embodiment, after the solder has been substantially removed from the openings in the underfill, the residual underfill is then removed. This may be accomplished by blasting using a mild abrasive media propelled against the underfill via nozzle 200, whereby the mild abrasive media is entrained in a compressed gas, such as, air. This abrasive blasting process is aggressive enough to remove the residual underfill in a controllable fashion by using the nozzle 200 to focus the gas entrained abrasive media at the underfill 40 at an angle such that the underfill material can be removed gradually from the surface without damaging the substrate surface. An advantage of the present process is that the openings formed in the underfill matrix, by removal of the solder material there from, facilitate the removal of the remaining underfill matrix by providing edge locations where the gas entrained abrasive media can undermine the underfill and begin lifting it off the substrate. A preferred mild abrasive media for this abrasive blasting is sodium bicarbonate, however, other known abrasive materials may be used including, but not limited to, very fine silica powder, fine alumina powder, and the like. The blasting media may also be directed against the underfill as a liquid slurry or suspended wet media rather than a gas entrained abrasive stream. This blasting process also cleans the surface of the exposed metallurgy 25 (e.g., exposed solder tinned contacts) at the chipsite on the exposed substrate surface. Alternately a chemical etchant can be used to selectively remove the perforated underfill which presents a large exposed surface for chemical dissolution. A combination of abrasive blasting and chemical attack can be employed to enhance the removal process if desired.

As a less preferred embodiment, referring to FIGS. 4A and 4B, since the etch process may not remove all of the solder from solder connections 30, the openings formed in the underfill matrix may be subjected to a cleaning process to remove any residual solder within such openings. Any known cleaning process may remove this residual solder. In so doing, wherein the underfill matrix 40 has maintained its original height as shown in FIG. 4A, the underfill matrix is left with empty, openings 31 substantially equivalent in size to the sizes of the solder connections 30. Alternatively, referring to FIG. 4B, wherein the original height of the solder connections 30 and underfill matrix 40 have been reduced to a reduced height "H." the underfill matrix 40 is left with empty, openings 33 substantially equivalent in size to the sizes of the reduced height solder connections 30. After this cleaning process, top surfaces of the exposed metallurgy 25 at the substrate surface are then fully exposed at the bottoms of openings 31, 33.

Figure 5A:
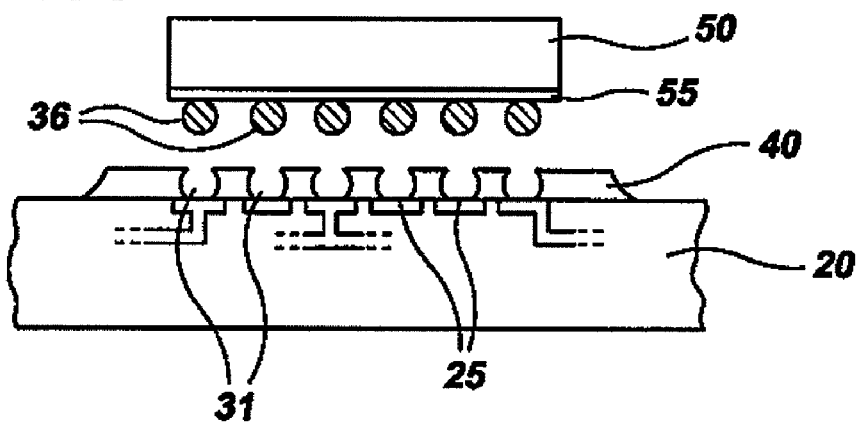
FIGS. 5A-B are alternate embodiments showing the steps of providing new solder connections on a blank perform for reworking the electronic modules of FIGS. 4A and 4B, respectively.
Figure 5B:
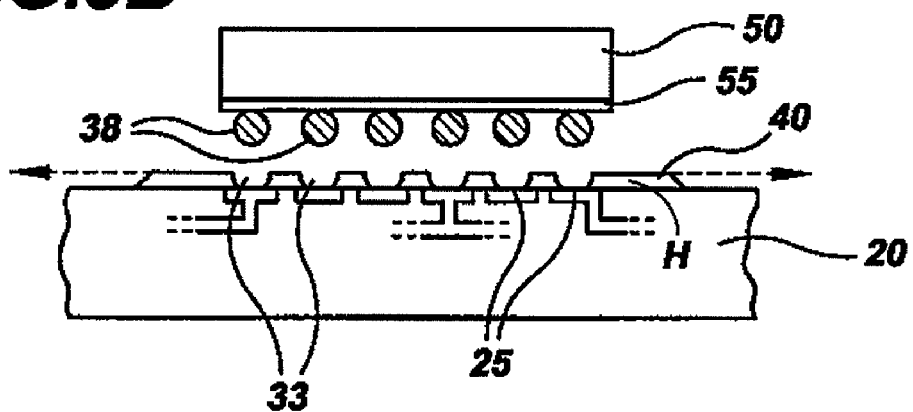
Figure 5C:
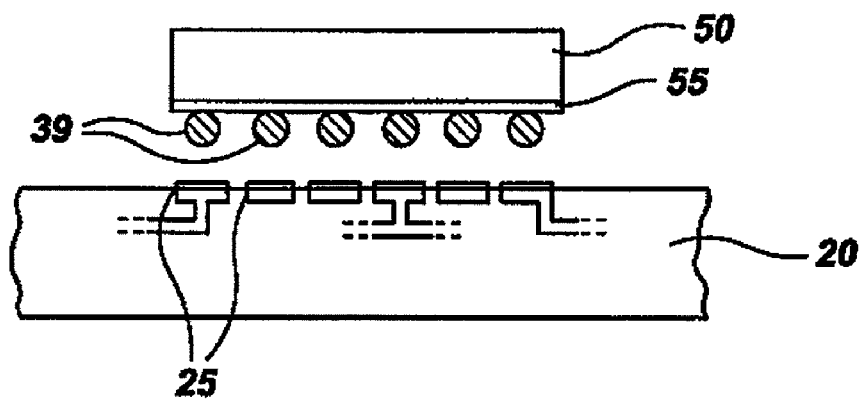
FIG. 5C shows a preferred embodiment of the invention showing the steps of providing new solder connections on a blank perform for reworking the electronic module of FIG. 4C which has had the underfill removed and the surface of the substrate cleaned.

Referring to FIGS. 5A-5C, the exposed metallurgy 25 (i.e., exposed metal contacts or pads) at the substrate surface are then redressed with solder. In so doing, a temporary blank 50 is provided with an array of solder connections in a pattern corresponding to the pattern of the exposed metallurgy 25. An essential feature is that the array of solder connections is deposited onto the blank in a manner that allows such solder to be fully released from the blank and transferred onto the exposed chipsite to ensure reproducible transfer of solder. This is preferably accomplished by providing a suitable release layer 55 on the blank 50. The release layer 55 is preferably a continuous coating applied to a side of the blank. Alternatively, the release layer can be provided in a pattern that matches the positions of the solder contacts to be deposited onto the blank, which correspondingly match the solder pads on the chipsite to be reworked.

The deposition process for depositing solder onto the release layer 55 must be chosen to ensure that the solder contacts do not fall off the blank during manufacture, handling and subsequent placement and transfer onto the chipsite of the substrate to be reworked. A preferred method to pattern solder onto the blank 50 includes evaporation of Pb, Sn and their alloys, whereby the solder is deposited onto the release layer 55 without melting such solder. Alternate methods include electroless plating and electroplating of patterned solders onto a thin electrically conductive layer, which would be consumed in the solder reflow process during transfer to the chipsite to be reworked. It is important not to heat the solder bumps on the substrate to near their melting temperature since their behavior should allow complete release from the substrate at this temperature only during transfer to the reworked chipsite.

The blank 50 is preferably a silicon blank, with a release layer 55 of any material that does not adhere strongly with the solder connections deposited thereon. The solder may comprise any type of solder that is suitable for the end use of the resultant electronic module including, but not limited to, a eutectic, near eutectic, non-eutectic, high melting point solder, low melting point solder, or any combination thereof. Preferably, the solder comprises a solder having a melting point low enough so as not to degrade the underfill matrix 40. In a preferred embodiment, this solder comprises a eutectic PbSn solder. For instance, wherein the array of solder connections solder connections comprise a high melting point solder the release layer 55 may comprise, but is not limited to, a polyester film, a polyethylene film, a nonwetting metal layer such as chromium and the like. Wherein the solder connections comprise a low melting point solder the release layer 55 may comprise, but is not limited to, a polymer film (e.g., a polyamide film), a thermoset plastic film, and the like.

Referring to FIG. 5C, in the preferred embodiment, wherein the underfill matrix has been completely removed from the substrate surface, the volume of solder deposited onto the blank 50 is in an amount sufficient to allow complete wetting of the exposed metallurgy 25 (i.e., exposed metal contacts or pads) on the chipsite, while still maintaining enough height to wet the solder C4 connection of a replacement die. In so doing, the volume of solder connections 39 deposited onto the blank 50 is preferably between about 10-50% of the volume of the original solder connections. Alternatively, referring to FIGS. 5A and 5B, the position of the array of solder connections may correspond to openings 31, 33 within residual matrix 40, whereby the solder of these array of solder connections 36 is deposited onto the release layer 55 of blank 50 in an amount sufficient for filling openings 31, 33, respectively.

Figure 6A:
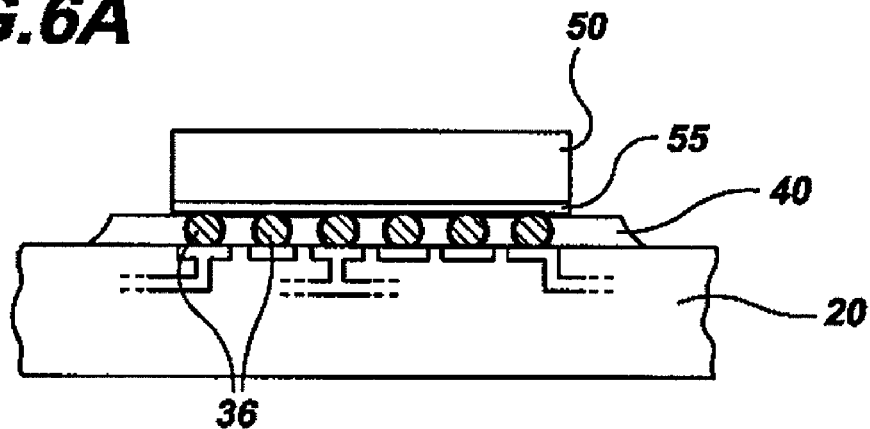
FIGS. 6A-C are alternate embodiments showing the steps of transferring the new solder connections of FIGS. 5A-C, respectively, from the blank perform onto the exposed metallurgy of the substrate.
Figure 6B:
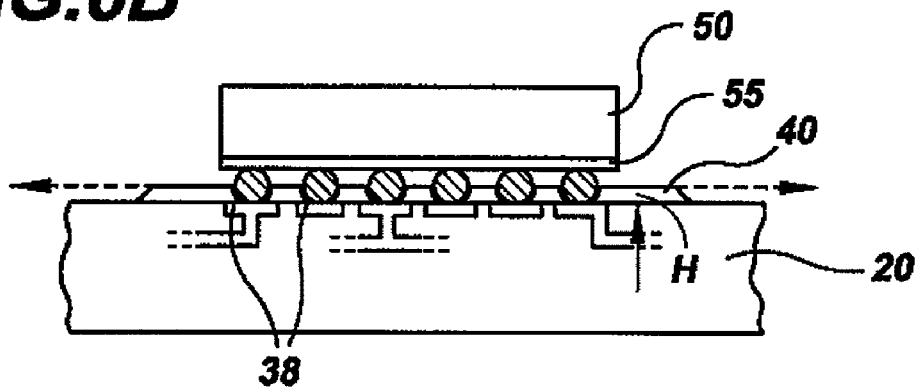
Figure 6C:
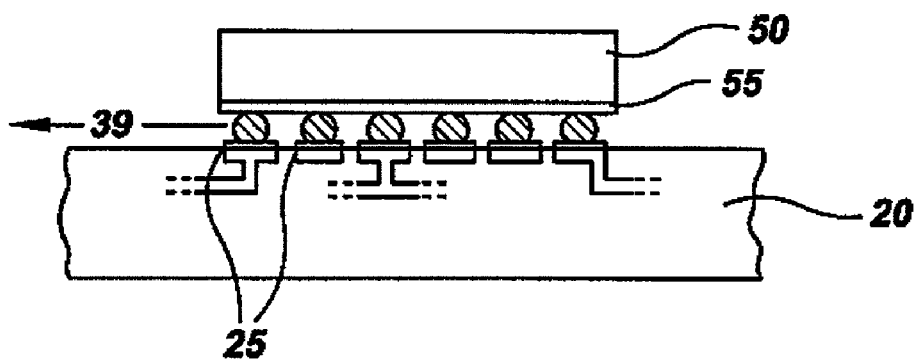
Figure 7A:
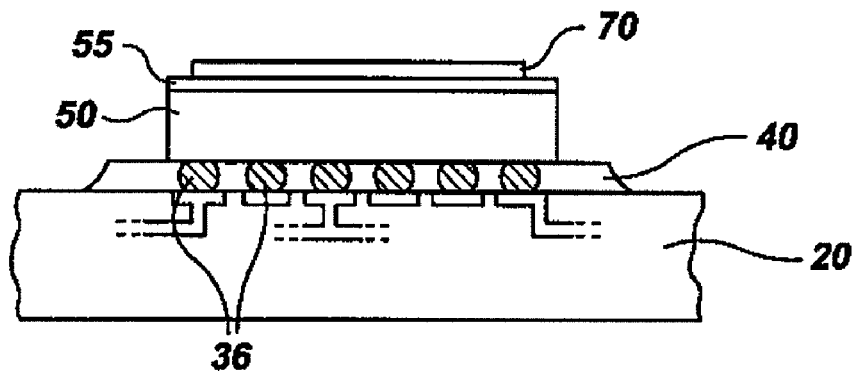
FIGS. 7A-C are alternate embodiments showing the steps of providing a blank with a weight over the structures of FIGS. 6A-C, respectively, for flattening the surfaces of the transferred solder connections.
Figure 7B:
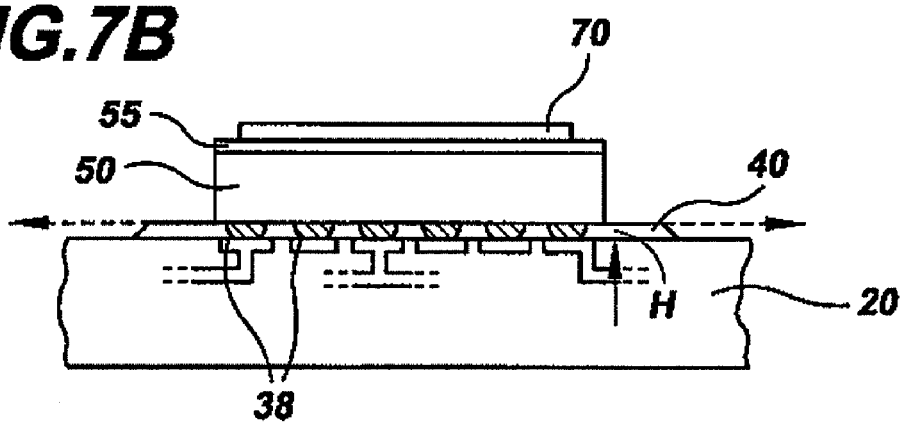
Figure 7C:
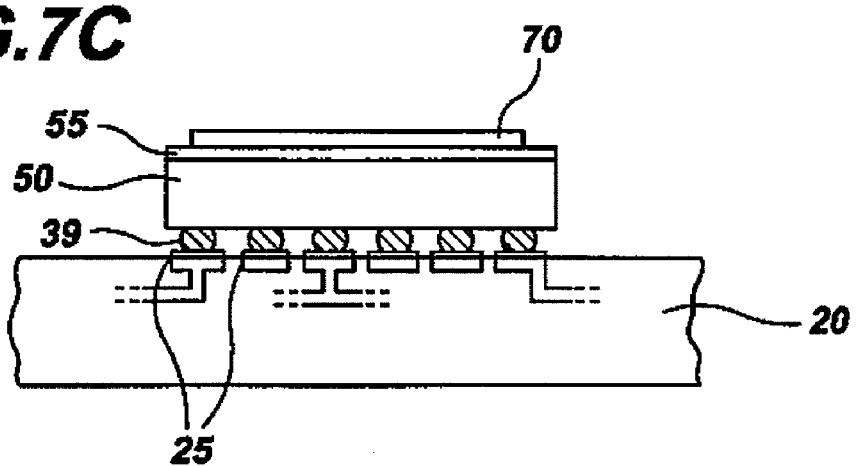

Referring to FIGS. 6A-C, the blank 50 carrying the array of solder connections 36, 38, 39, respectively, is then positioned over the electronic module and the solder connections aligned with the exposed metallurgy 25 (i.e., exposed contacts or pads on the chipsite), which may reside at the bottoms of openings 31 and 33 as shown respectively in FIGS. 5A and 5B. Preferably, the solder connections contact the exposed metallurgy. A flux is provided for the removal of oxides during the subsequent reflow process. This flux may be applied as a paste or gel to the blank, or even introduced during the reflow process in a vapor phase. Since the flux is typically tacky, wherein it is applied to the blank it also holds the blank 50 in position during handling and in transport. The substrate 20 and blank 50 are then heated to reflow the solder connections 36, 38, 39 for the transfer of such solder connections from the blank 50 onto the exposed metallurgy 25 (i.e., exposed contacts or pads) at the chipsite on the substrate 20 for joining such transferred solder connections to solder connections of a new chip or die.

However, during the transfer process the transferred solder connections 36, 38, 39 assume a rounded shape, such that, the tops of these transferred solder connections lift up the blank 50. In so doing, wherein underfill material remains on the substrate (FIGS. 6A and 6B) the blank 50 may be lifted above the top surface of the underfill matrix. An essential feature of all embodiments of the invention is that these rounded transferred solder connections be flattened. In so doing, the blank 50 is removed from the module after completion of this first reflow process. Either a new blank (e.g. a second silicon blank) having a smooth planar surface is provided, or blank 50 having a smooth planar backside is flipped over such that this planar backside contacts the raised solder connections.

A weight 70 is then applied onto the blank to press the blank down onto the rounded bumps during a subsequent (i.e., second) reflow operation. The weight 70 is chosen from materials that can withstand the reflow temperatures without degradation and which have a density sufficient to minimize their size. Materials for the weight(s) 70 include, but are not limited to, stainless steel alloys denoted as type 316 and 310, molybdenum, tungsten, copper and similar high density materials. The weight 70 has a mass sufficient for transferring enough load through the blank and onto the transferred solder connections during this second reflow process to flatten the transferred solder connections without spreading out such solder connections to short adjacent solder bumps. The mass of the weight will be affected by the number of solder contacts, spacing, chipsite X-Y size, solder volume, solder type and desired final solder height after flattening. The desired mass of the weight(s) may be obtained by varying the mass placed onto the blank during flattening reflows over a series of reflow trials to determine the desired mass for a specific chipsite configuration. Typical masses may range from about 0.01 grams to about 0.1 grams per solder contact.

Figure 8A:
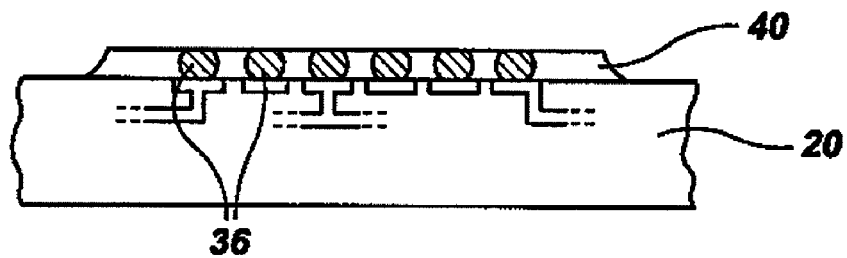
FIGS. 8A-C show alternate intermediate reworked electronic modules of the invention having reworked solder connections with planar surfaces for receiving a new chip/die.
Figure 8B:
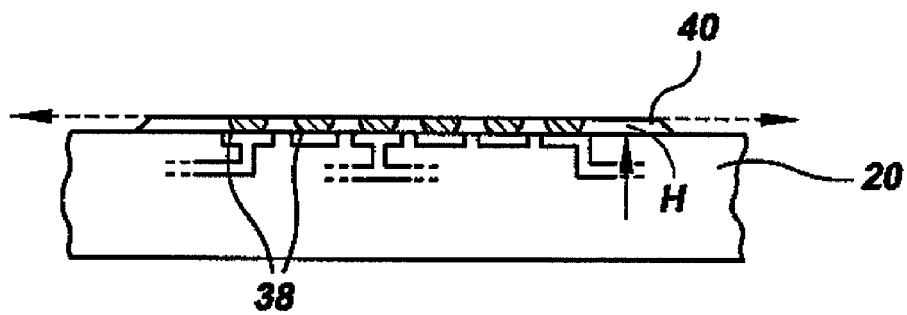
Figure 8C:
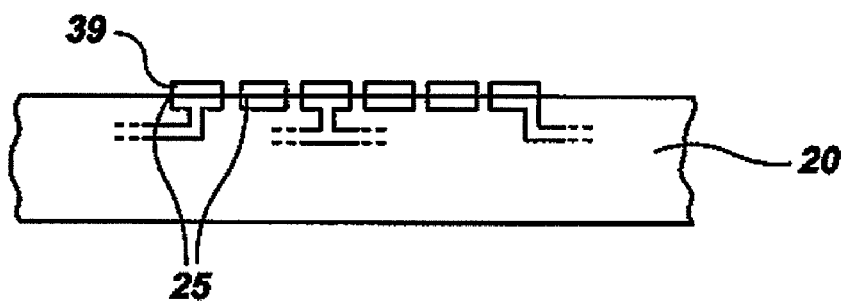

After completion of this second reflow process, as shown in FIGS. 8A-C, the blank and weight(s) are then removed to reveal solder connections 36, 38, 39 having flat surfaces for receiving solder connections (e.g., solder bumps) for the subsequent attachment of a new chip. Wherein the underfill material 40 remains on the substrate surface, the flattened solder connections 36, 38 preferably have flattened top surfaces that are substantially the same heights and planar with a top surface of the remaining underfill matrix 40.

Before attaching a new component, the transferred solder connections 36, 38, 39 on the substrate surface are inspected for 100% wettability to ensure all the transferred solders are entirely present and flat. If the present rework process has achieved 100% wettability, then a new component 80 may be attached to the module as discussed further below. As discussed above, this new component or components may include, but is not limited to, a semiconductor chip, a module, a carrier, an interposer, and the like, or even combinations thereof. Again for ease of understanding the invention, and not to limit the invention in any way, this new component will be referred to as a new chip 80.

Figure 9A:
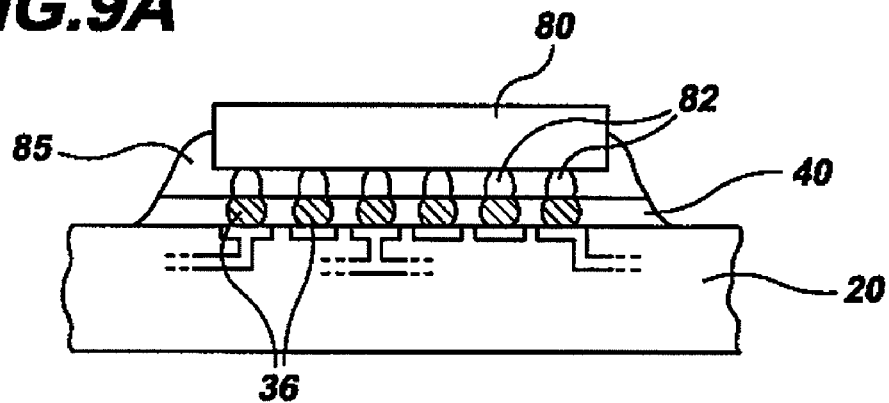
FIGS. 9A-C are alternate embodiments showing the steps of attaching a new chip/die to the modules of FIGS. 8A-C, respectively, to provide the resultant reworked electronic modules of the invention.
Figure 9B:
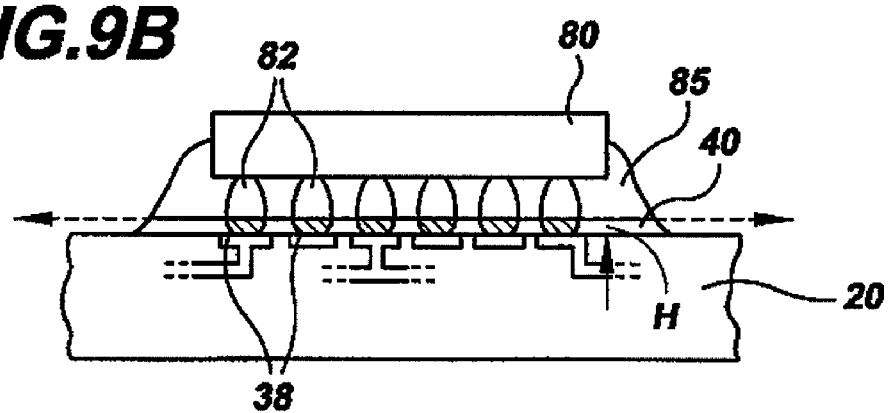
Figure 9C:
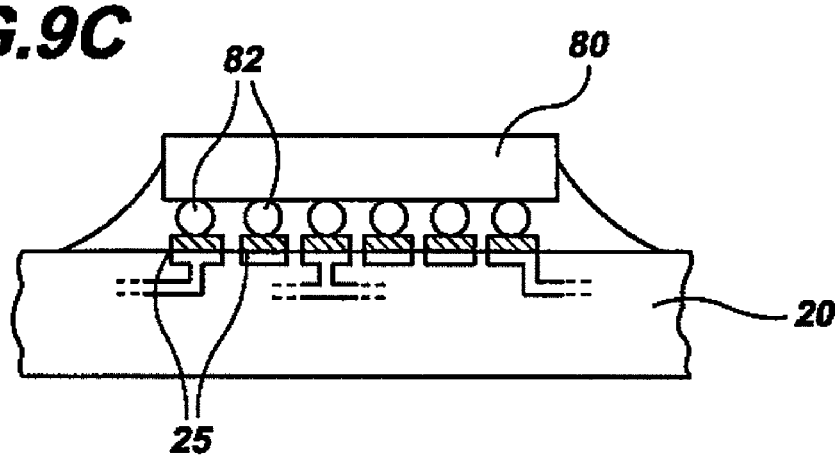

However, if 100% wettability has not been achieved, then the above processing steps may be repeated from the solder etching step forward. The abrasive cleaning process, though not needed to remove underfill in this operation, may provide cleaning of the surfaces of the etched solder connections. A new blank substrate is provided for depositing a fresh array of solder connections onto contacts/pads at the chipsite and reflowed as described previously. Flattening and subsequent reinspection as described above are then performed to confirm the solder coverage and surface flatness of these solder connections Once it is determined that the solder connections 36, 38, 39 are entirely present and flattened, a new component (e.g., a new chip 80) is attached to the module as shown in FIGS. 9A-C. In so doing, the new chip 80 having solder bumps 82 is positioned over the module such that the solder bumps 82 on the chip 80 are aligned with and contact the flattened surfaces of solder connections 36, 38, 39. These solder bumps 82 may comprise any type of solder that is suitable for the end use of the resultant electronic module and has a melting point low enough so that it will not degrade the underfill matrix, if remaining on above the chip site, or underfill material of adjacent dies or components, if present on the module, during reflow. Alternatively, the solder bumps 82 may be a high melting temperature metal or solder which is readily wetted by low temperature solder contacts on the substrate to form a soldered contact between both surfaces. The die bump metal need not be a solder when a low temperature solder is used on the chipsite contact pads. It could also be a copper, nickel alloy of these or other electrically conductive metals since the solder contact will wet and join to these metals and form a reliable connection.

That is, the solder bumps 82 may be the same solder used for solder connections 36, 38, 39 or they may be a different solder. Wherein the solder material of solder bumps 82 and solder connections 36, 38, 39 are different, such solder materials may be a low melting point solder (i.e., bumps 82) and a high melting point solder (i.e., solder connections 36, 38, 39), two different low melting point solders within the same liquidus temperature range, or even two different high melting point solders within the same liquidous temperature range. In the preferred embodiment, wherein the solder connections 36, 38 comprise a low melting point PbSn solder, the solder bumps 82 also comprise a low melting point solder within the same liquidus temperature range as solder connections 36, 38 so that the underfill matrix 40 will not be degraded during reflow of the bumps 82.

In attaching chip 80, the module is heated to a temperature sufficient to cause the solder to reflow and join the die bumps to the flattened solder connections on the chipsite of the module. A flux may be used at the solder-ball interface to facilitate solder wetting as described previously. In so doing, the bottom surface of the solder bumps 82 join with the flattened surface of the solder connections 36, 38, 39 to form reworked solder connections of the electronic module. Again, the temperature of this second reflow process is low enough so that it does not degrade any underfill material residing on the substrate.

After joining the new chip, the module is electrically tested, and if found to be electrically functional, the space between the new chip and the substrate is underfilled. This underfill material both joins the new chip to the substrate and encapsulates the reworked solder connections. This underfill material may be applied using known techniques and equipment. For example, the underfill material may be applied adjacent to the periphery of chip 80, whereby capillary action draws the underfill encapsulation material into the space between the chip and substrate (FIG. 9C), or between the chip and remaining underfill matrix 40 (FIGS. 9A-B), and between the reworked solder connections. Referring to FIGS. 9A-B, underfill matrix 85 and underfill matrix 40 together join the new chip to the substrate. The benefits of the combined underfill matrices are discussed above. Once the new chip has been attached, any encapsulation protecting hierarchy on the module may then be removed.

Accordingly, the present invention provides easy, efficient and cost effective rework methods and structures for the recovery of high value MCM/SCM electronic modules, thereby avoiding the need for completely rebuilding or scrapping such modules. By removing all of the solder from solder connections residing within the underfill matrix, thereby exposing metallurgical interconnects of the substrate, followed by the adhesive-free transfer of solder onto such interconnect sites, the invention advantageously provides controlled wetting of this join. The controlled wetting of the invention is achieved by the transfer and reflow of new solder directly onto the exposed interconnect sites at the bottoms of the openings within the underfill matrix. The present controlled wetting advantageously provides a durable and reliable solder-interconnect join without adversely affecting the integrity and electrical performance of the resultant module, as compared to conventional uncontrolled wetting approaches that join solder onto the originally existing solder of the module prior to rework. Another advantage of the invention is that the foregoing rework method and material set can be implemented across a variety of differing types and material sets of electronic packages.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for reworking an underfilled module comprising:
   providing a module having a component joined to a substrate by solder connections, said solder connections being encapsulated by an underfill matrix;
   removing said component to reveal said solder connections encapsulated within said underfill matrix;
   removing said solder connections from said underfill matrix to form openings therein having exposed metallurgy of said module at a bottom of said openings;
   transferring solder onto said exposed metallurgy to form transferred solder connections;
   flattening said transferred solder connections to provide flattened solder connections;
   joining solder connections of a new component to said flattened solder connections; and
   applying an underfill material to join said new component to said substrate.

2. The method of claim 1 wherein said substrate is selected from the group consisting of a ceramic substrate, a silicon substrate, a glass substrate and an organic substrate.

3. The method of claim 1 wherein said component and said new component are each selected from the group consisting of a semiconductor chip, a module, a carrier, an interposer, and combinations thereof.

4. The method of claim 1 wherein said solder connections comprise a material selected from the group consisting of a low melting point solder, a high melting point solder, and combinations thereof.

5. The method of claim 1 wherein said underfill matrix comprise a material selected from the group consisting of a rapid cure material, a low profile cure material, a high performance cure material, and a reworkable cure material.

6. The method of claim 1 further including removing said underfill matrix to expose said metallurgy of said module on a surface of said substrate.

7. The method of claim 1 wherein at least a portion of said underfill matrix remains on said substrate such that said solder is transferred into said openings in said underfill matrix to contact said exposed metallurgy and form transferred solder connections within said underfill matrix.

8. The method of claim 1 wherein said step of removing said solder material comprises:
 etching said solder connections out of said underfill matrix to leave openings within said underfill matrix; and
 cleaning any residual solder out of said openings to expose metallurgy of said substrate at a bottom of said openings within said underfill matrix.

9. The method of claim 1 wherein said step of transferring solder into said openings comprises:
 providing a blank having a release layer on a surface thereof;
 depositing an array of solder connections on said release layer of said blank in a pattern corresponding to said exposed metallurgy;
 providing said array of solder connections over said exposed metallurgy;
 heating said module to transfer said array of solder connections from said blank onto said exposed metallurgy; and
 removing said blank.

10. The method of claim 1 wherein said step of flattening said transferred solder connections comprises:
 providing a planar surface of another substrate in contact with said transferred solder connections; and
 applying pressure to said another substrate whereby said planar surface flattens said transferred solder connections to form flattened solder connections.

11. The method of claim 1 further including, after said component has been removed but prior to removing said solder material, reducing heights of both said solder connections and said underfill matrix.

12. The method of claim 10 wherein said heights of said solder connections and said underfill matrix may be reduced anywhere from below original heights of said solder connections and said underfill matrix down to about 10 microns above said exposed metallurgy.

13. The method of claim 1 wherein after said component has been removed, said solder connections and said underfill matrix remain at their original heights during said subsequent steps.

14. A method for reworking an underfilled module comprising:
 providing a module having a component joined to a substrate by solder connections, said solder connections being encapsulated by an underfill matrix;
 removing said component to reveal said solder connections encapsulated within said underfill matrix;
 removing at least a portion of both said solder connections and said underfill matrix;
 removing said solder connections from said underfill matrix to leave openings within said underfill matrix;
 removing said underfill matrix, thereby exposing metallurgy of said module on a surface of said substrate;
 providing a blank having an array of solder connections in a pattern corresponding to said exposed metallurgy;
 transferring said array of solder connections from said blank to contact said exposed metallurgy;
 flattening said transferred solder connections to provide flattened solder connections;
 joining solder connections of a new component to said flattened solder connections to form reworked solder connections; and
 applying an underfill material to join said new component to said substrate and encapsulate said reworked solder connections.

15. The method of claim 14 wherein said step of transferring said array of solder connections comprises:
 providing said blank having a release layer on a surface thereof with said array of solder connections deposited on said release layer;
 aligning said array of solder connections with said exposed metallurgy;
 heating said module to transfer said array of solder connections from said blank onto said exposed metallurgy; and
 removing said blank.

16. The method of claim 15 wherein said step of flattening said transferred solder connections comprises:
 providing a planar surface of another blank in contact with said transferred solder connections;
 heating said module; and
 applying pressure to said another blank whereby said heat and pressure flatten said transferred solder connections.

17. The method of claim 14 wherein said heights of said solder connections and said underfill matrix are reduced anywhere from below original heights of said solder connections and said underfill matrix down to about 10 microns above said exposed metallurgy.

18. The method of claim 14 wherein said flattened solder connections and said solder connections of said new component each comprise a solder material having a melting point low enough so as not to degrade any underfill matrix residing on said module.

19. The method of claim 14 wherein said flattened solder connections and said solder connections of said new semiconductor each comprise a solder material selected from the group consisting of a eutectic solder, a near eutectic solder, a non-eutectic solder, a low melting point solder, a high melting point solder, and any combination thereof.

20. An intermediate semiconductor structure for reworking an underfilled module comprising:
 a substrate of said underfilled module, said substrate having metallurgy on a surface thereof;
 an array of transferred solder connections in contact with said metallurgy of said substrate; and
 flattened surfaces of said array of transferred solder connections for connection to solder connections of an electronic component.

* * * * *